United States Patent [19]
Nolan et al.

[11] Patent Number: 6,057,721
[45] Date of Patent: May 2, 2000

[54] REFERENCE CIRCUIT USING CURRENT FEEDBACK FOR FAST BIASING UPON POWER-UP

[75] Inventors: James B. Nolan, Chandler; David Susak, Phoenix, both of Ariz.

[73] Assignee: Microchip Technology Incorporated, Chandler, Ariz.

[21] Appl. No.: 09/065,003

[22] Filed: Apr. 23, 1998

[51] Int. Cl.[7] ........................................ H03L 7/00
[52] U.S. Cl. ............................ 327/143; 327/543
[58] Field of Search ............................ 323/311, 312, 323/313, 314, 315, 316, 901; 327/142, 143, 198, 530, 534, 535, 538, 539, 540, 541, 542, 543, 545, 546

[56] References Cited

U.S. PATENT DOCUMENTS

| | | | |
|---|---|---|---|
| 4,399,399 | 8/1983 | Joseph | 323/315 |
| 4,857,823 | 8/1989 | Bitting | 323/314 |
| 5,087,830 | 2/1992 | Cave et al. | 307/296.6 |
| 5,610,506 | 3/1997 | McIntyre | 323/313 |
| 5,646,518 | 7/1997 | Lakshmikumar et al. | 323/316 |
| 5,742,155 | 4/1998 | Susak et al. | 323/901 |
| 5,751,142 | 5/1998 | Dosho et al. | 323/316 |
| 5,856,742 | 1/1999 | Vulih et al. | 323/315 |
| 5,861,737 | 1/1999 | Goerke et al. | 323/282 |
| 5,861,771 | 1/1999 | Matsuda et al. | 327/540 |
| 5,867,013 | 2/1999 | Yu | 323/314 |

*Primary Examiner*—Timothy P. Callahan
*Assistant Examiner*—Jeff Zweizig
*Attorney, Agent, or Firm*—Ronald L. Chichester; Paul N. Katz; Frohwitter

[57] ABSTRACT

A fast start-up circuit for use in integrated circuits where there are internal nodes of reference circuits that need to be charged to a predetermined voltage level at a quicker rate than that delivered by the typical ramping up of supply power. The circuit a current driven approach, which is unique from the voltage driven approaches found in the prior art. The circuit is comprised of a high gain reference circuit and a current generator. The reference circuit is comprised of a bias generator and a high gain amplifier. The invention is characterized by a current generator which is capable of rapidly injecting relatively high levels of current into the reference circuit or sinking relatively high levels of current from the reference circuit or both. The invention is further characterized by a current driven feedback loop which deactivates the current generator once start-up is achieved and the high gain reference circuit approaches the quiescent point.

6 Claims, 2 Drawing Sheets

REFERENCE CIRCUIT USING CURRENT FEEDBACK FOR FAST BIASING UPON POWER-UP

RELATED APPLICATIONS

This U.S. Patent Application is an improvement to U.S. Pat. No. 5,742,155 entitled "ZERO CURRENT START-UP CIRCUIT," issued Apr. 21, 1998 in the name of David Susak et al., assigned to the same assignee as the present U.S. Patent Application, and is incorporated by reference.

BACKGROUND OF THE INVENTION

1. Field of the Invention

This invention relates generally to start-up circuits and, more specifically, the present invention relates to start-up circuits for reference circuits having internal nodes that need to be charged to a predetermined voltage level by incorporating a current driven design.

2. Description of the Prior Art

In certain types of electrical circuits, there are internal nodes that need to be quickly charged to a predetermined voltage level. The normal application of power to a circuit, typically VDD, results in a slow ramping of voltage that is insufficient to effectuate the proper operation of the reference circuit.

The prior art describes circuits with simple diode feedback loops with low gain circuits that do not satisfactorily solve the problem of slow voltage ramp up. Furthermore, these start-up circuits are characterized as voltage driven circuits and contain no overdrive capability.

The invention described in U.S. Pat. No. 5,742,155 entitled "ZERO CURRENT START-UP CIRCUIT" also describes a voltage driven circuit. However, unlike the prior art, this invention discloses overdrive capability that initially drives the output voltage of the high gain amplifier to a much higher level than required. The feedback loop returns the voltage level to that needed by the reference circuit.

The reference circuit for the previously patented invention was intended to drive a voltage reference circuit such as a bandgap or other types. This application required a current mirror with a diode and resistor pair in series to regulate the output voltage to 1.2 volts. The present invention, not specifically intended for a voltage reference, does not incorporate this circuitry.

The previously patented invention uses a voltage feedback implementation and is therefore voltage driven. The present invention relies on a current feedback approach and is therefore current driven. This approach results in a start-up circuit with potentially wider application.

The previously patented invention also relies on logic gate means to effectuate the feedback mechanism. In particular embodiments, the logic gate means can include a latch device, which could prohibit start-up if the latch was initialized to an erroneous state. The present invention does not rely on latches or logic gate means for the feedback loop.

Therefore, a need existed to provide a fast start-up circuit that incorporates a new approach and new circuitry not found in the prior art.

SUMMARY OF THE INVENTION

It is an object of the present invention to provide a fast start-up circuit that relies on a current driven feedback loop.

It is another object of the present invention to provide a fast start-up circuit that initially overdrives the reference circuit before settling at a quiescent point.

It is another object of the present invention to provide a fast start-up circuit that does not employ latching components.

It is still another object of the present invention to provide a fast start-up circuit that operates with a smooth transition to reduce ringing.

In accordance with one embodiment of the present invention a fast start-up circuit comprises a high gain reference circuit, a current generator coupled to the high gain reference circuit for initializing the high gain reference circuit to an active state, a current injection path between the high gain reference circuit and the current generator for providing input current to the high gain reference circuit, and a feedback loop between the high gain reference circuit and the current generator for providing a feedback current to the current generator.

In accordance with another embodiment of the present invention, a fast start-up circuit comprises a high gain reference circuit, a current generator coupled to the high gain reference circuit for initializing the high gain reference circuit to an active state, a current extraction path between the high gain reference circuit and the current generator for providing an output current from the high gain reference circuit to the current generator, and a feedback path coupled to the high gain circuit and the current generator for providing a feedback current to the current generator.

In accordance with another embodiment of the present invention, a fast start-up circuit comprises a high gain reference circuit, a current generator coupled to the high gain reference circuit for initializing the high gain reference circuit to an active state, a current injection path coupled to the high gain reference circuit and the current generator for providing input current to the high gain reference circuit, a current extraction path coupled to the high gain reference circuit and the current generator for providing an output current from the high gain reference circuit to the current generator, and a feedback path coupled to the high gain reference circuit and the current generator for providing a feedback current to the current generator.

In accordance with another embodiment of the present invention, a method of providing a fast start-up circuit comprises the steps of providing a high gain amplifier for producing a feedback current, providing a bias generator coupled to the high gain amplifier for biasing the high gain amplifier and providing a current generator coupled to the high gain amplifier for producing a start-up current to initialize the high gain amplifier to an active state.

The foregoing and other objects, features, and advantages of the invention will be apparent from the following, more particular, description of the preferred embodiments of the invention, as illustrated in the accompanying drawings.

DETAILED DESCRIPTION OF THE PREFERRED EMBODIMENT

Figure 1:
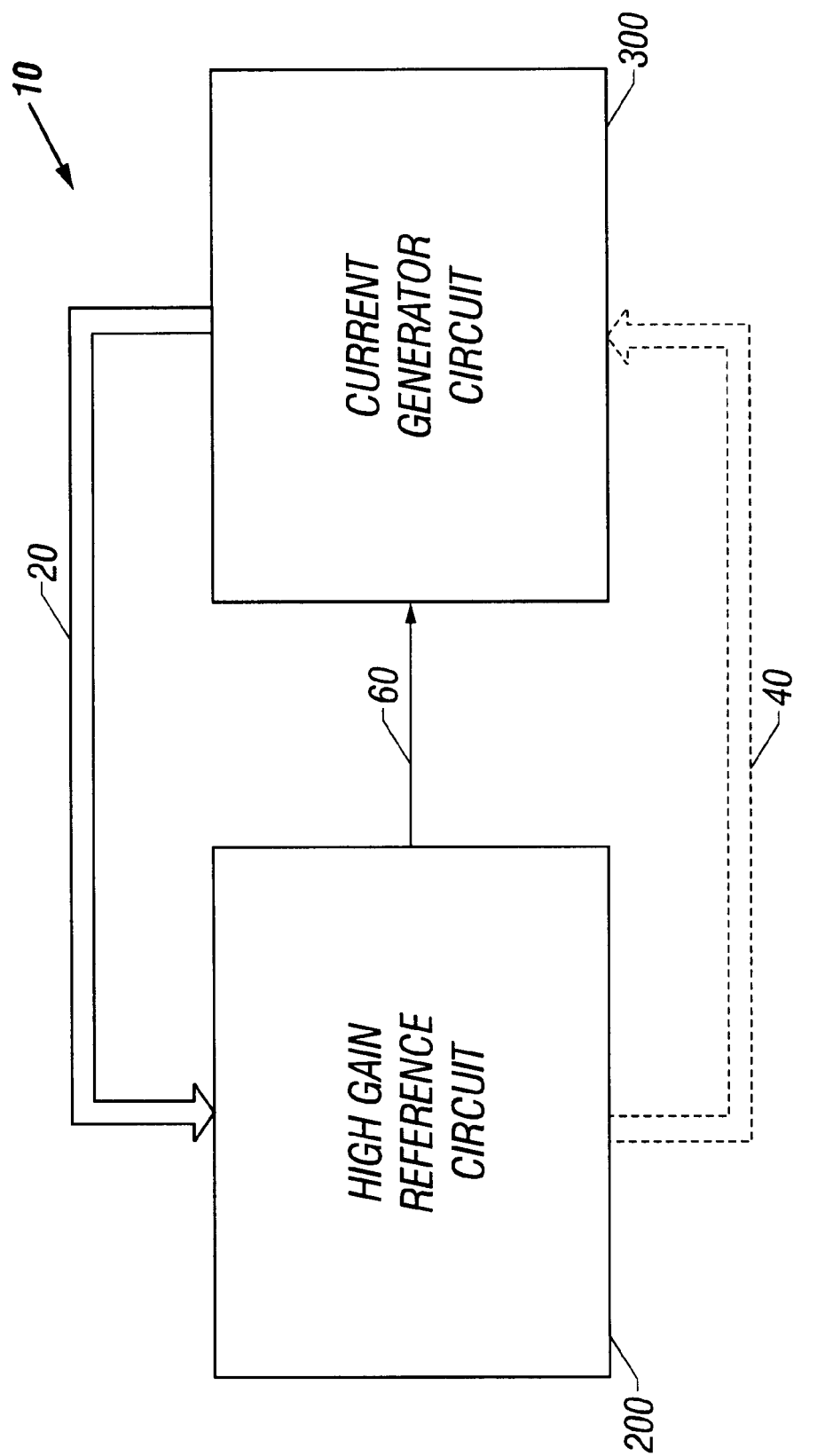
FIG. 1 is a block diagram of the present invention.

Referring to FIG. 1, a block diagram of the present invention is shown. In its simplest form the invention is comprised of a high gain reference circuit 200 and a current generator 300 which provides the initialization for the fast start-up function. The reference circuit 200 must reach its quiescent point (also referred to as operating point or steady state) very quickly when power is applied. This invention applies to those reference circuits 200 characterized as high gain, typically by the inclusion of a high gain amplifier. The purpose of the current generator circuit 300 is to expedite the reference circuit 200 in reaching the quiescent point.

Unlike the prior art which is dependent on a voltage driven approach, the present invention depends upon several current related functions. First, the current generator circuit 300 supplies the reference circuit 200 with a relatively large start-up current 20 when power ($V_{DD}$) is applied to the system, which temporarily overdrives the internal nodes of the reference circuit 200. Second, the current generator circuit 300 provides for extracting or pulling current out 40 of the reference circuit 200 as the large, start-up current is being applied and the high gain components of the reference circuit 200 ramp up. Third, the reference circuit 200 provides a current feedback loop 60 to turn off the current generator circuit 300 after the reference circuit 200 is initialized. With the current generator circuit 300 disabled, the reference circuit 200 quickly approaches its quiescent point.

In the preferred embodiment described below, the function of injecting a large start-up current into the reference circuit 200 is described in detail. Those skilled in the art will recognize that the current extraction function may be either combined with, or substituted for, the current injection function by reversing the polarity of $V_{DD}$ and ground and reversing the polarity of the transistor devices themselves. E.g. a p-channel device to become an n-channel device, and vice versa.

Figure 2:
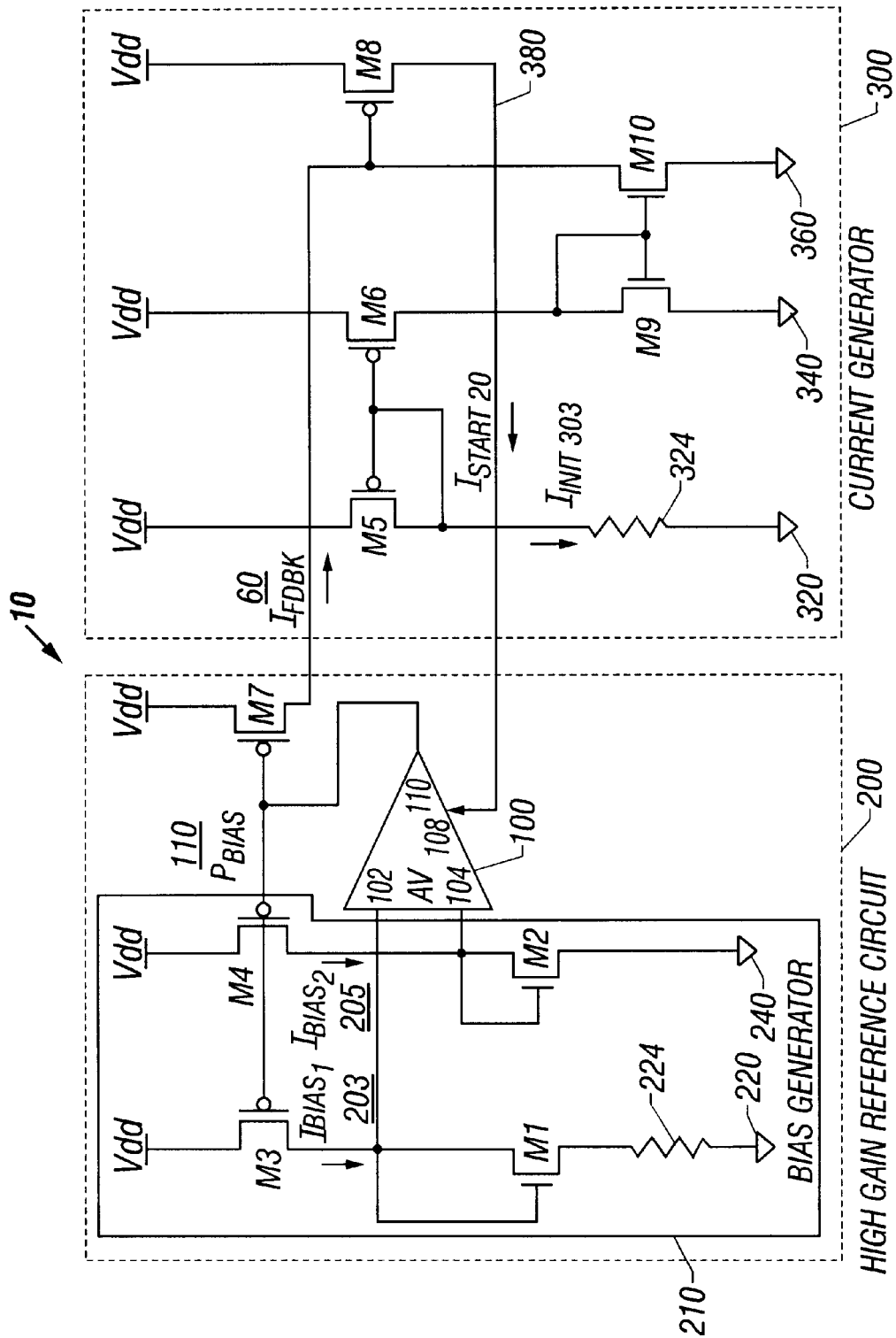
FIG. 2 is a schematic diagram of the preferred embodiment of the present invention.

Referring to FIG. 2, the preferred embodiment of the present invention as shown is comprised of a high gain amplifier 100 and a bias generator 210 coupled to a first and a second inputs 102 & 104 of the high gain amplifier 100 for biasing the high gain amplifier 100 and further coupled to $P_{BIAS}$ 110 of the high gain amplifier 100. The present invention is further comprised of a current generator 300 coupled to a third input 108 of the high gain amplifier 100 and further coupled to the $I_{FDBK}$ 60.

In the preferred embodiment, the bias generator is comprised of two conduction paths (220 & 240). The current generator 300 is comprised of four interconnected conduction paths (320, 340, 360 & 380). Other embodiments, which accomplish substantially the same function in substantially the same way, may encompass different configurations and numbers of conduction paths.

The high gain amplifier 100 performs two functions in the start-up sequence. First, the high gain amplifier 100 stabilizes the bias currents, $I_{BIAS1}$ 203 & $I_{BIAS2}$ 205 by connecting $P_{BIAS}$ 110 the output of the high gain amplifier 100, to the bias generator 210 to form a feedback loop. Also, the high gain amplifier 100 aids in reducing the delay associated with the initial application of power to the circuit 10 by temporarily overdriving the high gain amplifier before settling to a steady state condition.

The purpose of the bias generator 210 is to produce $I_{BIAS1}$ 203 & $I_{BIAS2}$ 205 based on a voltage differential ($\Delta V_{GS}$) and apply these bias currents to the high gain amplifier 100. Note that the first conduction path is very similar to the second conduction path with two key differences. First, the voltage differential $\Delta V_{GS}$ is established by the voltage drop across resistor 224 in the first conduction path, so that the gate to source voltages of M1 and M2 differ by an amount $\Delta V_{GS}$. Second, the channel width of transistor M1 is greater than the channel width of transistor M2 to compensate for the effect on the current by the resistor 224. Therefore the two transistors are dimensionally distinguishable. Thus, as the two bias currents 203 & 205 approach equipoise at the quiescent point, $I_{BIAS} = \Delta V_{GS}/R$.

The $P_{BIAS}$ 110 feedback from the high gain amplifier 100 at the control electrodes of transistors M3 and M4 serves to quickly stabilize the bias currents 203 & 205 and thus moves the output of the high gain amplifier 100 to a steady state condition upon application of $V_{DD}$. In the preferred embodiment, the channel widths of transistors M3, M4 and M7 are approximately equal. This results in a steady state current in transistors M3, M4 and M7.

Those skilled in the art of electronic circuit design will recognize that although the preferred embodiment utilizes a $\Delta V_{GS}$ bias generator, other types of bias generators that perform substantially the same function may be substituted (E.g. $\Delta V_{BE}$ generator).

The current generator 300 is best understood by beginning with the simultaneous application of power ($V_{DD}$) to the bias generator 210 and to the current generator 300. When power is applied, the current $I_{INIT}$ 303 begins flowing through transistor M5 because of a large non-critical resistor 324. $I_{INIT}$ 303 is mirrored at the control electrode of transistor M6.

In the preferred embodiment, the channel width of transistor M6 is typically less than the channel width of transistor M5 and therefore the two transistors are dimensionally distinguishable. Thus, only a small current flows through transistor M6 relative to transistor M5. Furthermore, the transistor pair M9 & M10 mirrors the M6 current. This has the effect of turning transistor M8 on hard, which overdrives the high gain amplifier 100. Also, in the preferred embodiment, the channel widths of transistors M9 and M10 are approximately equal. This results in the mirroring of current from transistor M6.

The control electrode for transistor M7 is coupled to $P_{BIAS}$ 110, the output of the high gain amplifier 100. Prior to the application of power, the high gain amplifier 100 is off, transistor M7 supplies no feedback current $I_{FDBK}$ 60 and transistor M10 pulls its drain to ground potential. With the transistor M10 drain at ground potential, the transistor M8 turns on hard with the application of $V_{DD}$ resulting in a large $I_{START}$ 20. $I_{START}$ 20 is applied to the high gain amplifier 100 at input 108.

Applying $I_{START}$ 20 to the high gain amplifier 100 temporarily overdrives the amplifier resulting in a relatively fast slewing of the amplifier output $P_{BIAS}$ 110. $P_{BIAS}$ 110 provides two functions. First, $P_{BIAS}$ 110 activates the two conduction paths 220 & 240 of the bias generator 210. The bias generator 210 in concert with the feedback loop from the output of the high gain amplifier 100 quickly drives $P_{BIAS}$ 110, and subsequently, $I_{BIAS1}$ 203 & $I_{BIAS2}$ 205, to a steady state. Second, $P_{BIAS}$ 110 biases transistor M7, which begins to source feedback current $I_{FDBK}$ 60. With transistor M7 designed to source a much greater current than transistor M10 is designed to sink, the drain of transistor M10 is pulled to $V_{DD}$, thereby turning off transistor M8. This results in effectively cutting off $I_{START}$ 20 except for a small trickle current through transistor M9, thereby shutting down the current generator 300. Since only current steering is used, a reference voltage is not required to disable the start-up circuit, as is the case in the prior art.

Although the invention has been particularly shown and described with reference to a preferred embodiment thereof, it will be understood by those skilled in the art that changes in form and detail may be made without departing from the spirit and scope of the invention.

What is claimed is:

1. A reference circuit using current feedback for fast biasing during power-up, said reference circuit comprising:

a controllable current generator having an output current path controlled by an input current path;

a bias generator for generating bias currents; and a reference amplifier having first and second inputs connected to the bias generator, a third input connected to the output current path of the controllable current generator, and an output connected to the input current path of the controllable current generator;

wherein, during power-up the output current path of the controllable current generator overdrives the third input of the reference amplifier thereby causing said reference circuit to quickly stabilize, and, during stabilization, the output of the reference amplifier causes the current generator to substantially reduce the current to the third input of the reference amplifier.

2. The reference circuit of claim 1, wherein the reference amplifier comprises an operational amplifier.

3. The reference circuit of claim 1, wherein the bias generator comprises two pair of series connected N-channel and P-channel field effect transistors, the first pair connected to the first input and the second pair connected to the second input of the reference amplifier.

4. The reference circuit of claim 3, wherein the first pair of the series connected N-channel and P-channel field effect transistors comprises a first conduction path and the second pair of the series connected N-channel and P-channel field effect transistors comprises a second conduction path.

5. The reference circuit of claim 1, wherein during power-up the controllable current generator temporarily overdrives the reference amplifier thereby causing a relatively fast slewing of the reference amplifier output.

6. A method using current feedback for fast biasing a reference circuit during power-up, said method comprising the steps of:

providing a controllable current generator having an output current path controlled by an input current path;

providing a bias generator for generating bias currents;

providing a reference amplifier having first and second inputs connected to the bias generator, a third input connected to the output current path of the controllable current generator, and an output connected to the input current path of the controllable current generator;

overdriving the third input of the reference amplifier with the output current path of the controllable current generator thereby causing said reference circuit to quickly stabilize during power-up; and reducing the current to the third input of the reference amplifier during power-up of the reference circuit by feeding the output of the reference amplifier to the input current path of the current generator.

* * * * *